United States Patent
Oshima

(10) Patent No.: US 12,426,223 B2
(45) Date of Patent: Sep. 23, 2025

(54) RADIO FREQUENCY MODULE AND COMMUNICATION DEVICE

(71) Applicant: Murata Manufacturing Co., Ltd., Kyoto (JP)

(72) Inventor: Takayuki Oshima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 336 days.

(21) Appl. No.: 18/333,677

(22) Filed: Jun. 13, 2023

(65) Prior Publication Data

US 2023/0328939 A1    Oct. 12, 2023

Related U.S. Application Data

(63) Continuation of application No. PCT/JP2021/046338, filed on Dec. 15, 2021.

(30) Foreign Application Priority Data

Dec. 25, 2020  (JP) .................................. 2020-217435

(51) Int. Cl.
*H05K 9/00* (2006.01)
*H05K 1/18* (2006.01)

(52) U.S. Cl.
CPC ........... *H05K 9/0026* (2013.01); *H05K 1/181* (2013.01); *H05K 9/006* (2013.01); *H05K 2201/10098* (2013.01)

(58) Field of Classification Search
None
See application file for complete search history.

(56) References Cited

U.S. PATENT DOCUMENTS

| | | | |
|---|---|---|---|
| 6,303,874 | B1 | 10/2001 | Muramatsu |
| 8,849,362 | B1 | 9/2014 | Saji et al. |
| 2006/0276158 | A1 | 12/2006 | Okabe |
| 2007/0176298 | A1 | 8/2007 | Osone et al. |
| 2017/0301986 | A1* | 10/2017 | Nguyen ................ H01L 21/268 |
| 2017/0324160 | A1* | 11/2017 | Khoury ................ H01Q 1/2283 |
| 2017/0338847 | A1 | 11/2017 | Reisner et al. |
| 2018/0261566 | A1 | 9/2018 | Babcock et al. |

(Continued)

FOREIGN PATENT DOCUMENTS

| | | |
|---|---|---|
| JP | H10-125830 A | 5/1998 |
| JP | 2007-188916 A | 7/2007 |

(Continued)

OTHER PUBLICATIONS

International Search Report for PCT/JP2021/046338 dated Mar. 8, 2022.

*Primary Examiner* — Frantz Bataille
(74) *Attorney, Agent, or Firm* — McDonald Hopkins LLC

(57) ABSTRACT

A radio frequency module includes a substrate having a first major surface and a second major surface that face each other, a first component disposed on or over the first major surface of the substrate, a second component disposed on the first component, a third component disposed on or over the first major surface of the substrate, and a metallic body connected to a ground. One end of the metallic body is connected to the first major surface of the substrate; and in plan view, the metallic body is disposed between the first component and the third component.

20 Claims, 8 Drawing Sheets

(56) References Cited

U.S. PATENT DOCUMENTS

| | | | |
|---|---|---|---|
| 2020/0020645 A1 | 1/2020 | Nakajima | |
| 2020/0203291 A1 | 6/2020 | Uejima | |
| 2020/0204159 A1 | 6/2020 | Onodera et al. | |
| 2020/0281102 A1 | 9/2020 | Otsubo et al. | |
| 2021/0005579 A1 | 1/2021 | Matsumoto | |

FOREIGN PATENT DOCUMENTS

| | | | |
|---|---|---|---|
| JP | 2010-161801 A | 7/2010 | |
| JP | 2015-111803 A | 6/2015 | |
| JP | 2020-102693 A | 7/2020 | |
| JP | 2020-102758 A | 7/2020 | |
| JP | 2020-113559 A | 7/2020 | |
| WO | 98/41067 A1 | 9/1998 | |
| WO | 2019/098316 A1 | 5/2019 | |
| WO | 2019/181590 A1 | 9/2019 | |

\* cited by examiner

RADIO FREQUENCY MODULE AND COMMUNICATION DEVICE

CROSS REFERENCE TO RELATED APPLICATION

This is a continuation of International Application No. PCT/JP2021/046338 filed on Dec. 15, 2021 which claims priority from Japanese Patent Application No. 2020-217435 filed on Dec. 25, 2020. The contents of these applications are incorporated herein by reference in their entireties.

BACKGROUND OF THE DISCLOSURE

Field of the Disclosure

The present disclosure relates to a radio frequency module and a communication device.

Description of the Related Art

A radio frequency module disclosed in Patent Document 1 is configured such that an output matching network device and a band select switch stacked on the output matching network device are disposed on a substrate.

Patent Document 1: U.S. Patent Application Publication No. 2017/0338847

BRIEF SUMMARY OF THE DISCLOSURE

When a third component, which is different from a first component (for example, the output matching network device) and a second component (for example, the band select switch), is disposed on the substrate in addition to the configuration of Patent Document 1, it may become difficult to achieve the isolation between a multilayer body formed by stacking the second component on the first component and the third component.

The present disclosure provides a radio frequency module and a communication device configured such that the isolation between the stacked components disposed on a substrate and another component disposed on the substrate can be improved.

According to an aspect of the present disclosure, a radio frequency module includes a substrate having a first major surface and a second major surface that face each other, a first component disposed on or over the first major surface of the substrate, a second component disposed on the first component, a third component disposed on or over the first major surface of the substrate, and a metallic body connected to a ground. One end of the metallic body is connected to the first major surface of the substrate; and in plan view, the metallic body is disposed between the first component and the third component.

According to an aspect of the present disclosure, a communication device includes an RF signal processing circuit that processes radio frequency signals transmitted and received via an antenna and the radio frequency module that transmits the radio frequency signals between the antenna and the RF signal processing circuit.

An aspect of the present disclosure makes it possible to improve the isolation between the stacked components disposed on a substrate and another component disposed on the substrate.

DETAILED DESCRIPTION OF THE DISCLOSURE

Figure 1:
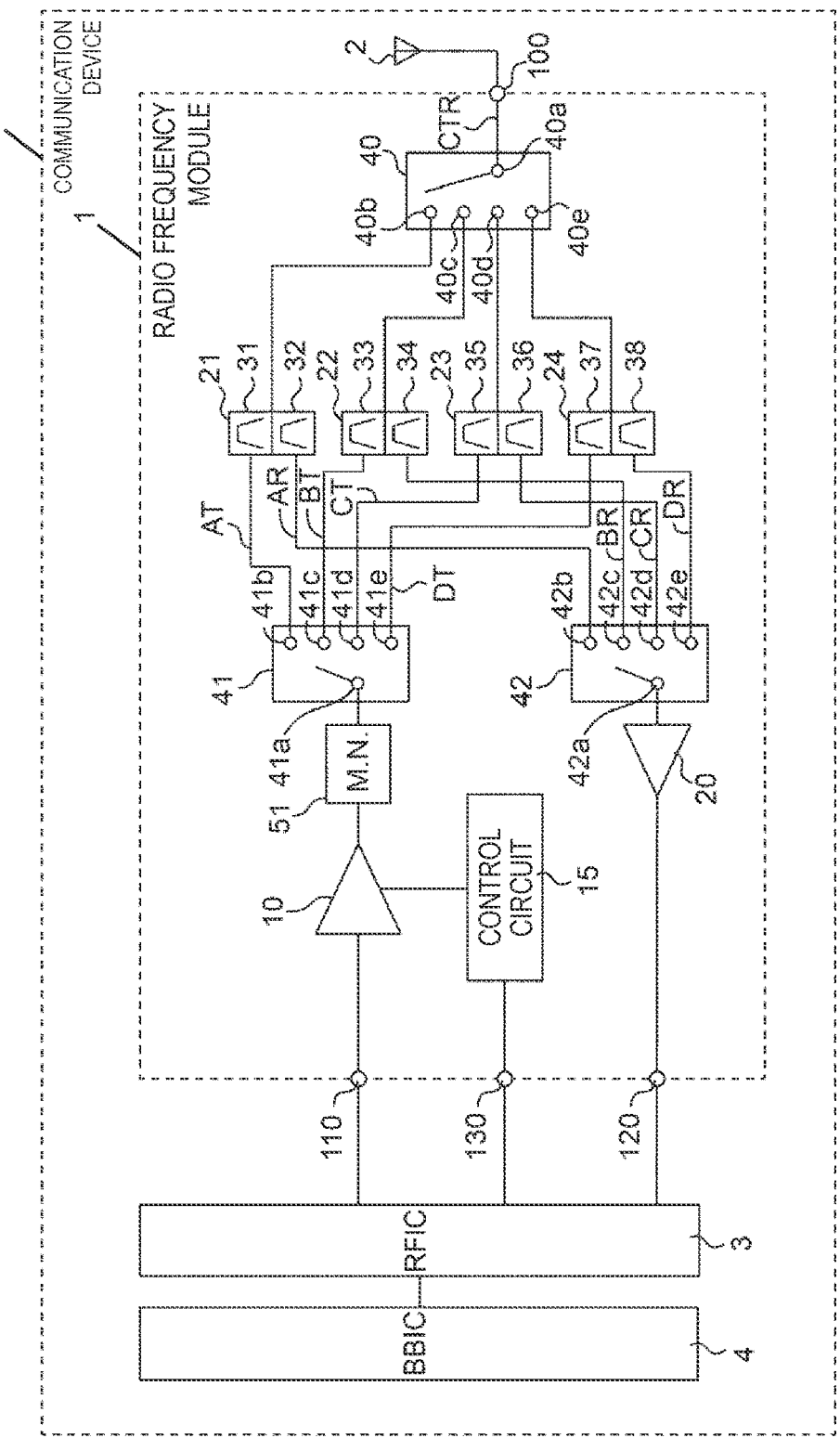
FIG. 1 is a circuit diagram illustrating an example of a configuration of a communication device including a radio frequency module according to a first embodiment.

Embodiments of the present disclosure are described below in detail. Each of the embodiments described below represents a general or specific example. Values, shapes, materials, components, and the layouts and connection configurations of the components in the embodiments, examples, and variations described below are just examples and are not intended to limit the present disclosure. Among components described in the examples and the variations below, components not recited in independent claims are optional components. Also, the sizes or the ratios of sizes of components illustrated in the drawings are not necessarily accurate. In the drawings, the same reference number is assigned to substantially the same components, and overlapping descriptions of those components are omitted or simplified.

Also, in the descriptions below, terms such as "parallel" and "perpendicular" indicating relationships between elements, terms such as "rectangular" indicating shapes of elements, and numerical ranges do not only indicate their exact meanings but may also indicate substantially equivalent ranges that vary by, for example, about a few percent.

In each of the drawings below, an X-axis and a Y-axis are orthogonal to each other in a plane that is parallel to the major surface of a substrate. Also, a Z-axis is perpendicular to the major surface of the substrate, a positive Z-axis direction indicates an upward direction, and a negative Z-axis direction indicates a downward direction.

Also, in a circuit configuration in this disclosure, "connected" indicates not only a case in which a circuit component is directly connected using a connection terminal and/or a wire conductor but also indicates a case in which a circuit component is electrically connected via another circuit component. Furthermore, "connected between A and B" indicates that a component is disposed between A and B and is connected to both of A and B.

Also, in a module configuration of this disclosure, "plan view" indicates a view of an object that is orthographically projected onto an XY plane from the positive Z-axis direction. "A component is disposed on a major surface of a substrate" indicates, in addition to a case in which the component is disposed on and in contact with the major surface of the substrate, a case in which the component is disposed above and not in contact with the major surface and a case in which the component is partially embedded in the major surface of the substrate. "A is disposed between B and C" indicates that at least one of multiple line segments connecting given points in B and given points in C passes through A.

In the descriptions below, "transmission path" indicates a transmission line constituted by, for example, wires for transmitting radio-frequency transmission signals, electrodes directly connected to the wires, and terminals directly connected to the wires or the electrodes. Also, "reception path" indicates a transmission line constituted by, for example, wires for transmitting radio-frequency reception signals, electrodes directly connected to the wires, and terminals directly connected to the wires or the electrodes. Furthermore, "transmission-reception path" indicates a transmission line constituted by, for example, wires for transmitting both of radio-frequency transmission signals and radio-frequency reception signals, electrodes directly connected to the wires, and terminals directly connected to the wires or the electrodes.

First Embodiment

[1-1. Communication Device]

FIG. 1 is a circuit diagram of a radio frequency module 1 and a communication device 5 according to a first embodiment. As illustrated in FIG. 1, the communication device 5 includes the radio frequency module 1, an antenna 2, an RF signal processing circuit (RFIC) 3, and a baseband signal processing circuit (BBIC) 4.

The RFIC 3 is an RF signal processing circuit that processes radio frequency signals transmitted and received via the antenna 2. Specifically, the RFIC 3 performs signal processing, such as down converting, on a radio-frequency reception signal inputted via a reception signal path of the radio frequency module 1 and outputs a reception signal generated by the signal processing to the BBIC 4. Also, the RFIC 3 performs signal processing, such as up-converting, on a transmission signal inputted from the BBIC 4 and outputs a radio-frequency transmission signal generated by the signal processing to a transmission signal path of the radio frequency module 1.

The BBIC 4 performs signal processing by using an intermediate frequency band lower than the frequency of a radio frequency signal transmitted through the radio frequency module 1. For example, a signal processed by the BBIC 4 is used as an image signal for displaying an image or as a voice signal for a call via a speaker.

The RFIC 3 also functions as a control unit that controls the connections of switches 40, 41, and 42 of the radio frequency module 1 based on a communication band (frequency band) being used. Specifically, the RFIC 3 switches the connections of the switches 40-42 of the radio frequency module 1 according to control signals (not shown). More specifically, the RFIC 3 outputs digital control signals for controlling the switches 40-42 to a control circuit 15. The control circuit 15 of the radio frequency module 1 controls the connections and disconnections of the switches 40-42 by outputting digital control signals to the switches 40-42 according to the digital control signals inputted from the RFIC 3. In the first embodiment, multiple communication bands with different frequency bands are used. For example, four communication bands A, B, C, and D are used, and the communication bands A, B, C, and D have different frequency bands.

The RFIC 3 also functions as a control unit that controls the gain of a power amplifier 10 of the radio frequency module 1 and a power supply voltage Vcc and a bias voltage Vbias supplied to the power amplifier 10. Specifically, the RFIC 3 outputs a digital control signal to a control signal terminal 130 of the radio frequency module 1. The control circuit 15 adjusts the gain of the power amplifier 10 by outputting a control signal and the power supply voltage Vcc or the bias voltage Vbias to the power amplifier 10 according to the digital control signal inputted via the control signal terminal 130. The control unit may instead be provided outside of the RFIC 3 and, for example, may be provided in the BBIC 4.

The antenna 2 is connected to an antenna connection terminal 100 of the radio frequency module 1, emits a radio frequency signal outputted from the radio frequency module 1, also receives a radio frequency signal from the outside, and outputs the received radio frequency signal to the radio frequency module 1.

In the communication device 5 according to the first embodiment, the antenna 2 and the BBIC 4 are optional components.

[1-2. Radio Frequency Module]

Next, a detailed configuration of the radio frequency module 1 is described.

As illustrated in FIG. 1, the radio frequency module 1 includes a power amplifier 10, a low-noise amplifier (LNA) 20, a control circuit 15, transmission filters 31, 33, 35, and 37, reception filters 32, 34, 36, and 38, a matching circuit 51, switches 40, 41, and 42, an antenna connection terminal 100, a transmission input terminal 110, a reception output terminal 120, and a control signal terminal 130.

The antenna connection terminal 100 is connected to the antenna 2. The transmission input terminal 110 receives transmission signals from the outside (RFIC 3) of the radio frequency module 1. The reception output terminal 120 supplies reception signals to the outside (RFIC 3) of the radio frequency module 1.

The power amplifier 10 is a transmission amplifier that amplifies transmission signals in the communication bands A through D. An input terminal of the power amplifier 10 is connected to the transmission input terminal 110, and an output terminal of the power amplifier 10 is connected to the switch 41 via the matching circuit 51.

The low-noise amplifier 20 is a reception amplifier that amplifies, with low noise, reception signals in the communication band A and the communication band B. An input terminal of the low-noise amplifier 20 is connected to the switch 42, and an output terminal of the low-noise amplifier 20 is connected to the reception output terminal 120.

The control circuit 15 adjusts the gain of the power amplifier 10 according to, for example, a digital control signal MIPI inputted via the control signal terminal 130. The control circuit 15 may be constituted by a semiconductor integrated circuit (IC). The semiconductor IC may be implemented by, for example, a complementary metal oxide semiconductor (CMOS). Specifically, the semiconductor IC is formed by a silicon-on-insulator (SOI) process.

The transmission filter 31 is included in a transmission path AT connecting the power amplifier 10 to the switch 40 and passes a transmission signal in a transmission band corresponding to the communication band A among transmission signals amplified by the power amplifier 10. The transmission filter 33 is included in a transmission path BT connecting the power amplifier 10 to the switch 40 and passes a transmission signal in a transmission band corresponding to the communication band B among transmission signals amplified by the power amplifier 10. The transmission filter 35 is included in a transmission path CT connecting the power amplifier 10 to the switch 40 and passes a transmission signal in a transmission band corresponding to the communication band C among transmission signals amplified by the power amplifier 10. The transmission filter 37 is included in a transmission path DT connecting the power amplifier 10 to the switch 40 and passes a transmission signal in a transmission band corresponding to the communication band D among transmission signals amplified by the power amplifier 10.

The reception filter 32 is included in a reception path AR connecting the low-noise amplifier 20 to the switch 40 and passes a reception signal in a reception band corresponding to the communication band A among reception signals inputted from the antenna connection terminal 100. The reception filter 34 is included in a reception path BR connecting the low-noise amplifier 20 to the switch 40 and passes a reception signal in a reception band corresponding to the communication band B among reception signals inputted from the antenna connection terminal 100. The reception filter 36 is included in a reception path CR connecting the low-noise amplifier 20 to the switch 40 and passes a reception signal in a reception band corresponding to the communication band C among reception signals inputted from the antenna connection terminal 100. The reception filter 38 is included in a reception path DR connecting the low-noise amplifier 20 to the switch 40 and passes a reception signal in a reception band corresponding to the communication band D among reception signals inputted from the antenna connection terminal 100.

Each of the transmission filters 31, 33, 35, and 37 and the reception filters 32, 34, 36, and 38 may be, but is not limited to, any of a surface acoustic wave filter (SAW filter), an acoustic wave filter using a bulk acoustic wave (BAW), an LC resonant filter, and a dielectric filter.

The transmission filter 31 and the reception filter 32 constitute a duplexer 21 with a pass band corresponding to the communication band A. The transmission filter 33 and the reception filter 34 constitute a duplexer 22 with a pass band corresponding to the communication band B. The transmission filter 35 and the reception filter 36 constitute a duplexer 23 with a pass band corresponding to the communication band C. The transmission filter 37 and the reception filter 38 constitute a duplexer 24 with a pass band corresponding to the communication band D.

Each of the duplexers 21 through 24 may also be implemented by one filter that transmits signals according to time division duplex (TDD). In this case, a switch for switching between the transmission and the reception is provided in at least one of the former stage and the latter stage of the one filter.

The matching circuit 51 is connected to a path connecting the power amplifier 10 to the switch 41 and provides the impedance matching between the power amplifier 10 and each of the transmission filters 31, 33, 35, and 37. The matching circuit 51 includes at least one inductor. The matching circuit 51 may be disposed in series in the path connecting the power amplifier 10 to the switch 41 or may be connected between the path connecting the power amplifier 10 to the switch 41 and a ground.

In place of or in addition to the matching circuit 51, a matching circuit may be connected to each of transmission paths between the switch 41 and the transmission filters 31, 33, 35, and 37. A matching circuit may also be connected to a reception path between the low-noise amplifier 20 and the switch 42.

The switch 40 includes a common terminal 40a and selection terminals 40b, 40c, 40d, and 40e. The common terminal 40a is connected to the antenna connection terminal 100, the selection terminal 40b is connected to the duplexer 21, the selection terminal 40c is connected to the duplexer 22, the selection terminal 40d is connected to the duplexer 23, and the selection terminal 40e is connected to the duplexer 24. That is, the switch 40 is an antenna switch disposed between the antenna connection terminal 100 and each of the duplexers 21 through 24, and connects and disconnects the antenna connection terminal 100 to and from each of the duplexers 21, 22, 23, and 24. The switch 40 is implemented by a multi-connection switch circuit capable of simultaneously establishing the connections between the antenna connection terminal 100 and the duplexers 21 through 24.

The switch 41 includes a common terminal 41a and selection terminals 41b, 41c, 41d, and 41e, is disposed in a transmission path connecting the power amplifier 10 to the transmission filters 31, 33, 35, and 37, and connects the power amplifier 10 to one of the transmission filters 31, 33, 35, and 37. The switch 41 is implemented by, for example, a single pole double throw (SPDT) switch circuit in which the common terminal 41a is connected to the output terminal of the power amplifier 10 via the matching circuit 51, the selection terminal 41b is connected to the transmission filter 31, the selection terminal 41c is connected to the transmission filter 33, the selection terminal 41d is connected to transmission filter 35, and the selection terminal 41e is connected to the transmission filter 37.

The switch 42 includes a common terminal 42a and selection terminals 42b, 42c, 42d, and 42e, is disposed in a reception path connecting the low-noise amplifier 20 to the reception filters 32, 34, 36, and 38, and connects the low-noise amplifier 20 to one of the reception filters 32, 34, 36, and 38. For example, the switch 42 is implemented by an SPDT switch circuit in which the common terminal 42a is connected to the input terminal of the low-noise amplifier 20, the selection terminal 42b is connected to the reception filter 32, the selection terminal 42c is connected to the reception filter 34, the selection terminal 42d is connected to the reception filter 36, and the selection terminal 42e is connected to the reception filter 38.

The transmission path AT is a signal path that transmits a transmission signal in the communication band A and connects the transmission input terminal 110 to the common terminal 40a of the switch 40. The transmission path BT is a signal path that transmits a transmission signal in the communication band B and connects the transmission input terminal 110 to the common terminal 40a of the switch 40. The transmission path CT is a signal path that transmits a transmission signal in the communication band C and connects the transmission input terminal 110 to the common terminal 40a of the switch 40. The transmission path DT is a signal path that transmits a transmission signal in the communication band D and connects the transmission input terminal 110 to the common terminal 40a of the switch 40.

Also, the reception path AR is a signal path that transmits a reception signal in the communication band A and connects the reception output terminal 120 to the common terminal 40a of the switch 40. The reception path BR is a signal path that transmits a reception signal in the communication band B and connects the reception output terminal 120 to the common terminal 40a of the switch 40. The reception path CR is a signal path that transmits a reception signal in the communication band C and connects the reception output terminal 120 to the common terminal 40a of the switch 40. The reception path DR is a signal path that transmits a reception signal in the communication band B and connects the reception output terminal 120 to the common terminal 40a of the switch 40.

A transmission-reception path CTR is a signal path that transmits transmission signals and reception signals in the communication bands A through D and connects the antenna connection terminal 100 to the common terminal 40a of the switch 40.

In the radio frequency module 1 with the circuit configuration described above, the power amplifier 10, the matching circuit 51, the switch 41, and the transmission filter 31 constitute a first transmission circuit that outputs a transmission signal in the communication band A toward the antenna connection terminal 100. The power amplifier 10, the matching circuit 51, the switch 41, and the transmission filter 33 constitute a second transmission circuit that outputs a transmission signal in the communication band B toward the antenna connection terminal 100. The power amplifier 10, the matching circuit 51, the switch 41, and the transmission filter 35 constitute a third transmission circuit that outputs a transmission signal in the communication band C toward the antenna connection terminal 100. The power amplifier 10, the matching circuit 51, the switch 41, and the transmission filter 37 constitute a fourth transmission circuit that outputs a transmission signal in the communication band D toward the antenna connection terminal 100.

Also, the low-noise amplifier 20, the switch 42, and the reception filter 32 constitute a first reception circuit that receives a reception signal in the communication band A from the antenna 2 via the antenna connection terminal 100. The low-noise amplifier 20, the switch 42, and the reception filter 34 constitute a second reception circuit that receives a reception signal in the communication band B from the antenna 2 via the antenna connection terminal 100. The low-noise amplifier 20, the switch 42, and the reception filter 36 constitute a third reception circuit that receives a reception signal in the communication band C from the antenna 2 via the antenna connection terminal 100. The low-noise amplifier 20, the switch 42, and the reception filter 38 constitute a fourth reception circuit that receives a reception signal in the communication band D from the antenna 2 via the antenna connection terminal 100.

With the circuit configuration described above, the radio frequency module 1 according to the present embodiment can perform at least one of: (1) transmission and reception of respective radio frequency signals in the communication bands A, B, C, and D and (2) simultaneous transmission, simultaneous reception, or simultaneous transmission and reception of at least two of radio frequency signals in the communication bands A through D.

In the radio frequency module according to the present disclosure, the transmission circuits and the reception circuits are not necessarily connected to the antenna connection terminal 100 via the switch 40, and the transmission circuits and the reception circuits may be connected to the antenna 2 via different terminals. Also, the radio frequency module according to the present disclosure may have any circuit configuration including at least two paths among the transmission paths, the reception paths, and the transmission-reception path, and a matching circuit disposed in each of the two paths. The radio frequency module only needs to include one of the first transmission circuit and the second transmission circuit. Also, the radio frequency module only needs to include one of the first reception circuit and the second reception circuit.

Here, in the radio frequency module 1 with the circuit configuration described above, when harmonic components of transmission signals or reception signals flowing through duplexers disposed in the transmission paths, the reception paths, and the transmission-reception path interfere with each other, the quality of the transmission signals or the reception signals may be degraded.

For this reason, the radio frequency module 1 according to the present embodiment has a configuration for suppressing the interference between the duplexers. A configuration of the radio frequency module 1 of the present embodiment for suppressing the interference between the duplexers is described below.

[1-3. Layout of Circuit Components of Radio Frequency Module]

Figure 2:
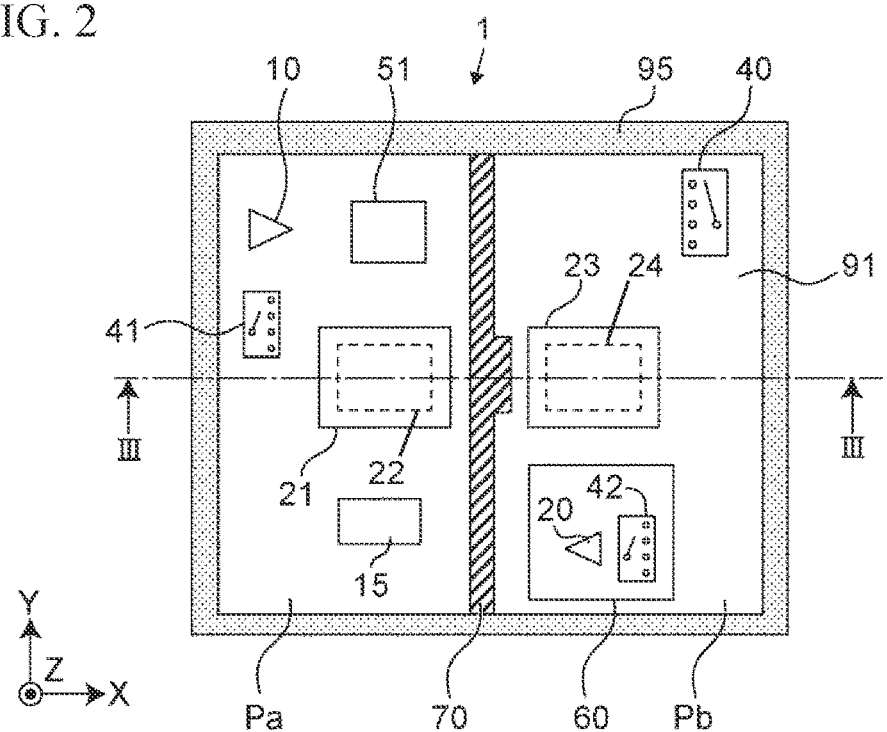
FIG. 2 is a plan view illustrating an example of a configuration of a radio frequency module.
Figure 3:
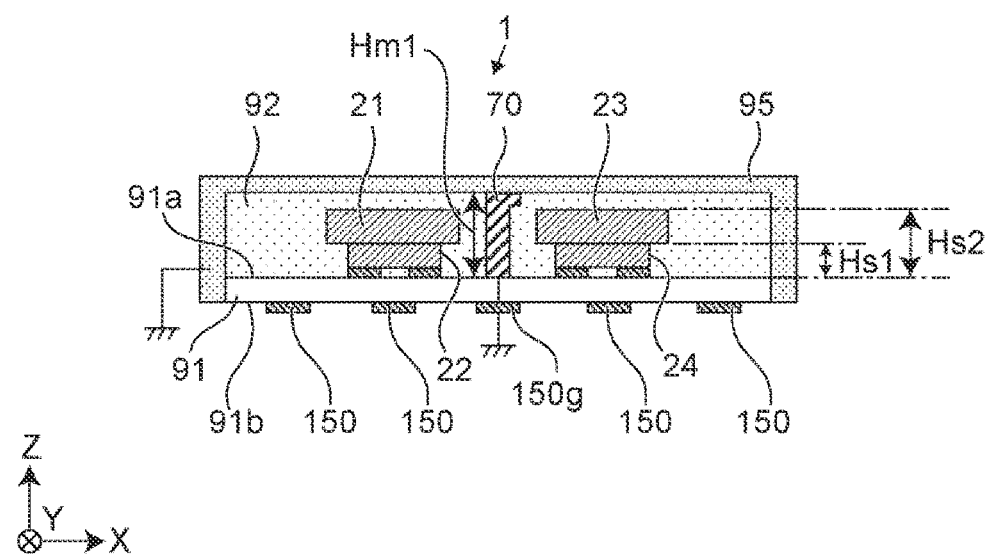
FIG. 3 is a cross-sectional view taken along line III-III of FIG. 2.

FIG. 2 is a plan view of the radio frequency module 1 according to the first embodiment. FIG. 3 is a cross-sectional view of the radio frequency module 1 according to the first embodiment. FIG. 2 illustrates a layout of circuit components when a first major surface 91a of a substrate 91 is seen from the positive Z-axis direction. FIG. 3 is a cross-sectional view taken along line III-III of FIG. 2.

As illustrated in FIG. 2, the radio frequency module 1 according to the first embodiment includes, in addition to the circuit configuration illustrated in FIG. 1, a substrate 91, a metallic body 70, a metal shield layer 95, a resin component 92, and external connection terminals 150.

The substrate 91 has a first major surface 91a on or over which the first through fourth transmission circuits and the first through fourth reception circuits are mounted. The substrate 91 is implemented by, for example, a low-temperature co-fired ceramics (LTCC) substrate with a multilayer structure formed of multiple dielectric layers, a high-temperature co-fired ceramics (HTCC) substrate, a component built-in substrate, a substrate including a redistribution layer (RDL), or a printed-circuit board. The antenna connection terminal 100, the transmission input terminal 110, the reception output terminal 120, and the control signal terminal 130 may also be formed on the substrate 91.

The duplexers 22 and 24 are connected to electrodes formed on the first major surface 91a of the substrate 91 by using, for example, solder bumps. The duplexers 21 and 23 may be directly connected to electrodes formed on the first major surface 91a of the substrate 91 by using, for example, wires or metal pins or may be connected to the electrodes via the duplexers 22 and 24. The area of the top surface of the duplexer 21 is greater than the area of the top surface of the duplexer 22. In plan view, the duplexer 22 is disposed within and overlaps a region defined by the perimeter of the duplexer 21. Similarly, in plan view, the duplexer 24 is disposed within and overlaps a region defined by the perimeter of the duplexer 23.

The resin component 92 is disposed on or over the first major surface 91a of the substrate 91 to at least partially cover circuit components constituting the first through fourth transmission circuits and the first through fourth reception circuits and cover the first major surface 91a of the substrate 91, and has a function to secure the reliability, such as the mechanical strength and the moisture resistance, of the circuit components. Accordingly, the resin component 92 at least partially covers the duplexers 21, 22, and 24. Here, the resin component 92 is an optional component of the radio frequency module according to the present disclosure.

The external connection terminals 150 are disposed on the second major surface 91b of the substrate 91. The radio frequency module 1 transmits and receives electric signals to and from an external substrate disposed to face the radio frequency module 1 from the negative Z-axis direction via multiple external connection terminals 150. A ground terminal 150g among the external connection terminals 150 is connected to a ground potential of the external substrate. Here, as illustrated in FIG. 3, each of the external connection terminals 150 may be a plane electrode formed on the second major surface 91b or a bump electrode formed on the second major surface 91b.

The metal shield layer 95 covers the surface of the resin component 92 and is connected to the ground. The metal shield layer 95 is, for example, a metal thin film formed by sputtering.

The metallic body 70 is erected on the first major surface 91a to extend toward the top surface of the resin component 92 in the positive Z-axis direction. For example, the metallic body 70 is in contact with a ground electrode on the first major surface 91a and the metal shield layer 95. Thus, at least two parts, e.g., the upper end and the lower end, of the metallic body 70 are connected to the ground to improve its electromagnetic field shielding function. The metallic body 70 may be in contact with the ground electrode on the first major surface 91a and with a shield surface that is among shield surfaces forming the metal shield layer 95 and is in contact with the top surface of the resin component 92; or may be in contact with the ground electrode on the first major surface 91a and with a shield surface that is among the shield surfaces forming the metal shield layer 95 and is in contact with the side surface of the resin component 92.

The metallic body 70 partitions the first major surface 91a into a first region Pa and a second region Pb. As illustrated in FIG. 2, the power amplifier 10, the control circuit 15, the matching circuit 51, the duplexers 21 and 22, and the switch 41 are disposed in the first region Pa of the first major surface 91a. On the other hand, the low-noise amplifier 20, the duplexers 23 and 24, and the switches 40 and 42 are disposed in the second region Pb of the first major surface 91a.

Although not illustrated in FIG. 2, wires constituting the transmission paths AT through DT, the reception paths AR through DR, and the transmission-reception path CTR illustrated in FIG. 1 are formed inside of the substrate 91 and on the first major surface 91a and the second major surface 91b.

As illustrated in FIG. 2, the metallic body 70 is disposed on the first major surface 91a and between the duplexers 21 and 22 and the duplexers 23 and 24 in plan view of the substrate 91.

With this configuration, because the metallic body 70 with the ground potential is disposed between the duplexers 21 and 22 disposed in the first region Pa and the duplexers 23 and 24 disposed in the second region Pb, it is possible to suppress the interference between the duplexers 21 and 22 and the duplexers 23 and 24 in different band communications.

The combinations of duplexers separated by the metallic body 70 are not limited to a combination of duplexers disposed in transmission-reception paths and a combination of duplexers disposed in transmission paths.

A length Hm1 of the metallic body 70 in the thickness direction of the substrate 91 is greater than or equal to a distance Hs2 from the first major surface 91a of the substrate 91 to the top surface of each of the duplexers 21 and 23. This configuration makes it possible to improve the isolation between the duplexer 21 and the duplexer 24 and between the duplexer 21 and the duplexer 23. This configuration also makes it possible to improve the isolation between the duplexer 22 and the duplexer 23 and between the duplexer 22 and the duplexer 24. Accordingly, even when communications in different bands are performed simultaneously using a duplexer disposed in the first region Pa and a duplexer disposed in the second region Pb, the interference between the duplexers can be suppressed.

The length Hm1 of the metallic body 70 in the thickness direction of the substrate 91 may be greater than or equal to a distance Hs1 from the substrate 91 to the top surface of each of the duplexers 22 and 24 and less than the distance Hs2 from the substrate 91 to the top surface of each of the duplexers 21 and 23. Even in this case, it is possible to improve the isolation between the duplexer 22 and the duplexer 24 and to suppress the interference between the duplexers even when communications in different bands are performed simultaneously by using the duplexers.

In the radio frequency module 1 according to the first embodiment, some of the circuit components (the power amplifier 10, the control circuit 15, the matching circuit 51, and the switch 41) connected to the transmission paths AT through DT are disposed in the first region Pa of the first major surface 91a, and some of the circuit components (the low-noise amplifier 20 and the switch 42) connected to the reception paths AR through DR are disposed in the second region Pb of the first major surface 91a. For example, the metallic body 70 divides the entire region of the substrate 91 into the first region Pa in which at least the power amplifier 10 in a transmission path is disposed and the second region Pb in which at least the low-noise amplifier 20 in a reception path is disposed. In other words, circuit components disposed in transmission paths and circuit components disposed in reception paths are separated by the metallic body 70. Thus, the first region Pa is a transmission-side component region in which circuit components included in transmission paths are mainly located, and the second region Pb is a reception-side component region in which circuit components included in reception paths are mainly located. This configuration makes it possible to improve the isolation between the transmission and the reception. The transmission-side component region may be the smallest possible rectangular region including components connected to the transmission paths AT through DT. The reception-side component region may be the smallest possible rectangular region including components connected to the reception paths AR through DR. Also, the substrate 91 may include two or more transmission-side component regions or two or more reception-side component regions partitioned by the metallic body 70 and another metallic body.

In the radio frequency module 1 according to the first embodiment, the low-noise amplifier 20 and the switch 42 may be included in one semiconductor IC 60. This makes it possible to reduce the height of the radio frequency module 1 and reduce the component mounting area in the first major surface 91a, and thereby makes it possible to reduce the size of the radio frequency module 1. Furthermore, the semiconductor IC 60 may include at least one of the switches 40 and 41.

Figure 4:
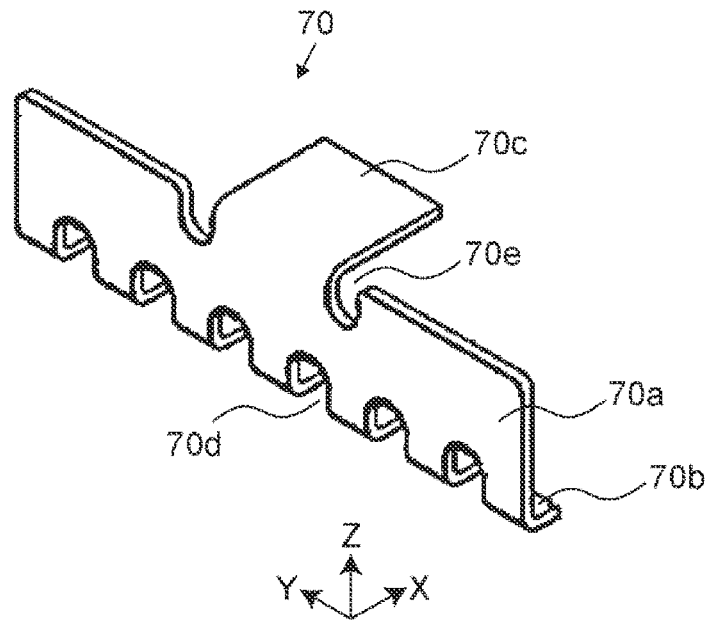
FIG. 4 is a perspective view of an entire metallic body.

Next, a detailed configuration of the metallic body 70 is described with reference to FIG. 4. FIG. 4 is a perspective view of the metallic body 70. The metallic body 70 includes a wall 70a that extends in a direction (Z direction) perpendicular to the substrate 90 and a direction (Y direction) parallel to the substrate 90, a substrate joint 70b that is bent from the lower end of the wall 70a in a direction perpendicular to the wall 70a and fixed to the substrate 91, and a top surface joint 70c that is bent from the upper end of a central portion of the wall 70a in a direction perpendicular to the wall 70a and is in contact with the metal shield layer 95. The metallic body 70 also includes multiple holes 70d formed at intervals in a portion of the wall 70a closer to the substrate 91 and two holes 70e formed at the base of the top surface joint 70c. The thickness of the wall 70a is, for example, 50 μm.

The metallic body 70 may instead have a pin shape that extends in the Z direction. For example, one pin-shaped metallic body 70 may be disposed between the duplexer 22 and the duplexer 24, and multiple pin-shaped metallic bodies 70 may be arranged in the Y direction between the duplexer 22 and the duplexer 24. This configuration can also improve the isolation between the duplexers.

[1-4. Effects]

The radio frequency module 1 described above includes the substrate 91 having the first major surface 91a and the second major surface 91b that face each other, the duplexer 22 and the duplexer 24 that are disposed on or over the first major surface 91a of the substrate 91, the duplexer 21 disposed on the duplexer 22, and the metallic body 70 connected to the ground. One end of the metallic body 70 is connected to the first major surface 91a of the substrate 91, and the metallic body 70 is disposed between the duplexer 22 and the duplexer 24 in plan view.

This configuration makes it possible to improve the isolation between the duplexer 22 and the duplexer 24 and thereby makes it possible to suppress the interference between the communication band B using the duplexer 22 and the communication band D using the duplexer 24 even when signals are transmitted and received simultaneously in these communication bands. This configuration also makes it possible to improve the isolation between a multilayer body, which is constituted by the duplexers 22 and 21, and the duplexer 24 and thereby makes it possible to suppress the interference between the communication band B using the duplexer 22, or the communication band A using the duplexer 21, and the communication band D using the duplexer 24 even when signals are transmitted and received simultaneously in these communication bands. Here, even in a case in which a second component, which is not limited to the duplexer 21, is stacked on a first component, which is not limited to the duplexer 22, and the metallic body 70 is disposed, in plan view, between the first component and a third component, which is not limited to the duplexer 24, the above configuration makes it possible to improve the isolation between the first component and the third component.

Figure 5:
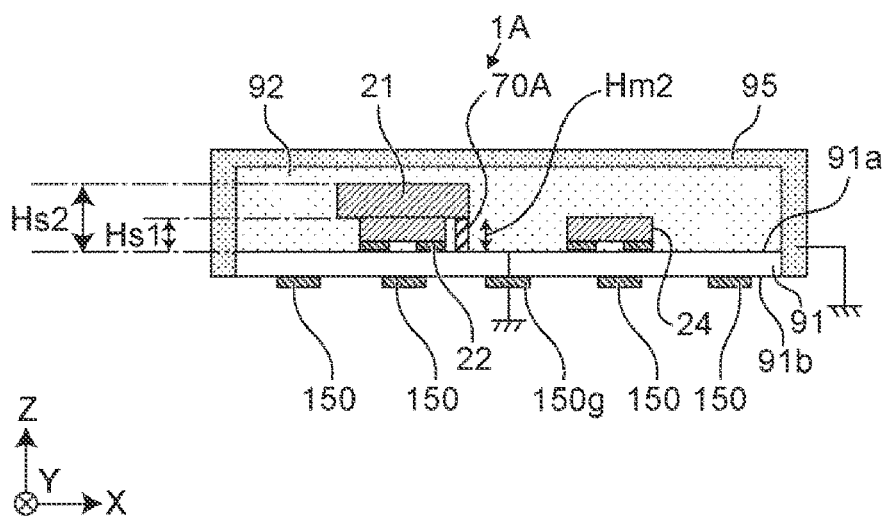
FIG. 5 is a cross-sectional view of a radio frequency module according to a first variation of the first embodiment.

Next, a radio frequency module 1A according to a first variation of the radio frequency module 1 of the first embodiment is described with reference to FIG. 5. FIG. 5 is a cross-sectional view of the radio frequency module 1A according to the first variation of the first embodiment.

As illustrated in FIG. 5, the radio frequency module 1A of this variation differs from the radio frequency module 1 of the first embodiment in that the duplexer 23 is not stacked on the duplexer 24 and a metallic body 70A is disposed in a different position. Below, the descriptions of the features common to the radio frequency module 1A of this variation and the radio frequency module 1 of the first embodiment are omitted, and the differences between them are mainly described.

The metallic body 70A of this variation connects the lower surface of the duplexer 21 to the first major surface 91a of the substrate 91. Accordingly, a length Hm2 of the metallic body 70A is the same as the length Hs1 from the first major surface 91a of the substrate 91 to the top surface of each of the duplexers 22 and 24.

This configuration also makes it possible to improve the isolation between the duplexer 22 and the duplexer 24 and thereby makes it possible to suppress the interference between the communication band B using the duplexer 22 and the communication band D using the duplexer 24 even when signals are transmitted and received simultaneously in these communication bands. Also, even when the metallic body 70A is disposed between the duplexer 22 and the duplexer 24 and the length Hm2 of the metallic body 70A is greater than or equal to the length Hs1 and less than the length Hs2 between the first major surface 91a of the substrate 91 and the top surface of the duplexer 21, it is possible, to a certain degree, to improve the isolation between the duplexer 21 and the duplexer 24 compared with a case in which the metallic body 70A is not provided between the duplexer 22 and the duplexer 24. Accordingly, it is possible to suppress the interference between the communication band A using the duplexer 21 and the communication band D using the duplexer 24 even when signals are transmitted and received simultaneously in these communication bands.

Figure 6:
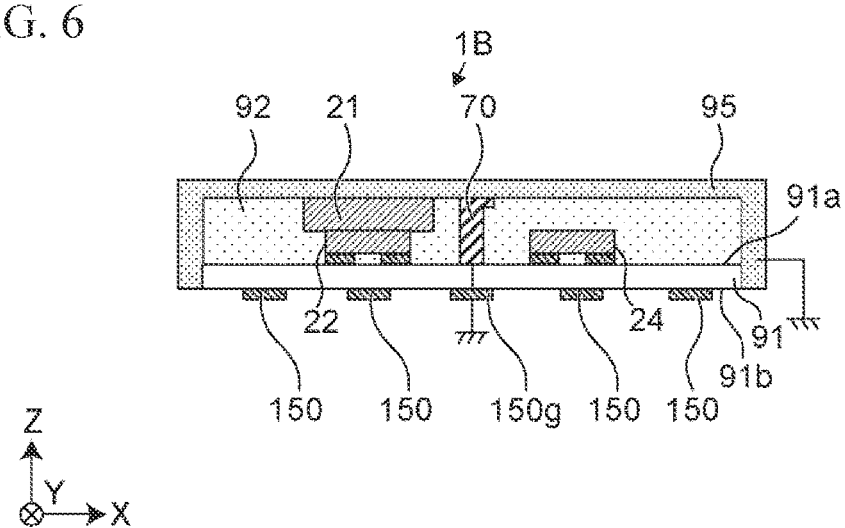
FIG. 6 is a cross-sectional view of a radio frequency module according to a second variation of the first embodiment.

Next, a radio frequency module 1B according to a second variation of the radio frequency module 1 of the first embodiment is described with reference to FIG. 6. FIG. 6 is a cross-sectional view of the radio frequency module 1B according to the second variation of the first embodiment. Below, the descriptions of the features common to the radio frequency module 1A of this variation and the radio frequency module 1 of the first embodiment are omitted, and the differences between them are mainly described.

As illustrated in FIG. 6, the radio frequency module 1B of this variation differs from the radio frequency module 1 of the first embodiment in that the top surface of the duplexer 21 of the second layer is in contact with the metal shield layer 95. This makes it possible to transfer the heat of the duplexer 21 to the metal shield layer 95 and thereby makes it possible to improve the heat dissipation of the duplexer 21.

Also, similarly to the radio frequency module 1 of the first embodiment, the radio frequency module 1B of this variation may be configured such that the duplexer 23 is stacked on the duplexer 24 and the top surface of the duplexer 23 is in contact with the metal shield layer 95. This makes it possible to transfer the heat of the duplexer 23 to the metal shield layer 95 and thereby makes it possible to improve the heat dissipation of the duplexer 23.

Figure 7:
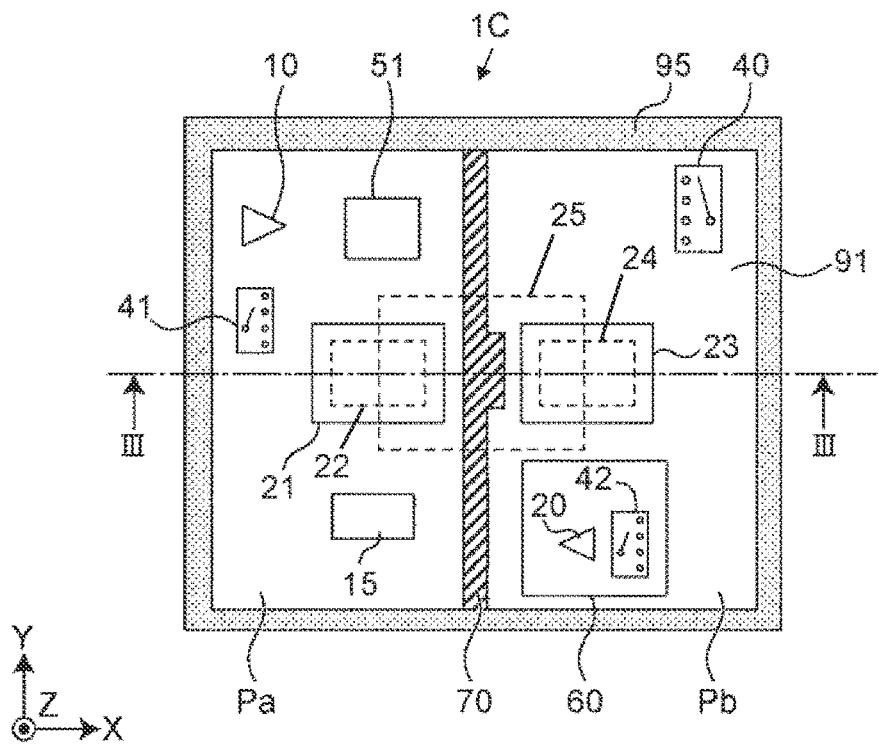
FIG. 7 is a plan view of a radio frequency module according to a third variation of the first embodiment.
Figure 8:
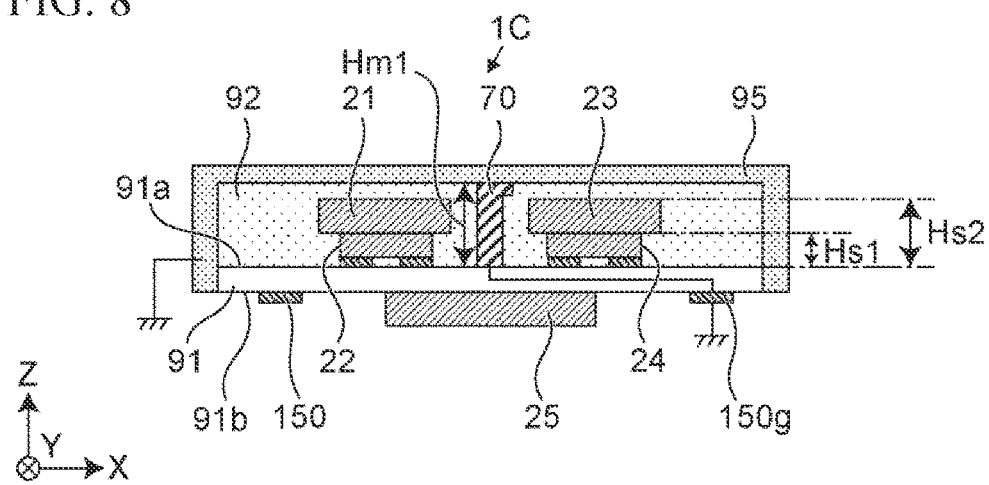
FIG. 8 is a cross-sectional view of the radio frequency module according to the third variation of the first embodiment.

Next, a radio frequency module 1C according to a third variation of the radio frequency module 1 of the first embodiment is described with reference to FIGS. 7 and 8. FIG. 7 is a plan view of the radio frequency module 1C according to the third variation of the first embodiment. FIG. 8 is a cross-sectional view taken along line III-III of FIG. 7. Below, the descriptions of the features common to the radio frequency module 1C of this variation and the radio frequency module 1 of the first embodiment are omitted, and the differences between them are mainly described.

As illustrated in FIGS. 7 and 8, while the radio frequency module 1 of the first embodiment has a single-sided mounting configuration, the radio frequency module 1C of this variation has a double-sided mounting configuration.

A semiconductor IC 25 is disposed on the second major surface 91b of the substrate 91. As illustrated in FIG. 7, in plan view, each of the duplexers 21, 22, 23, and 24 overlaps at least a part of the semiconductor IC 25. This configuration makes it possible to reduce the size of the radio frequency module 1C.

Second Embodiment

Figure 9:
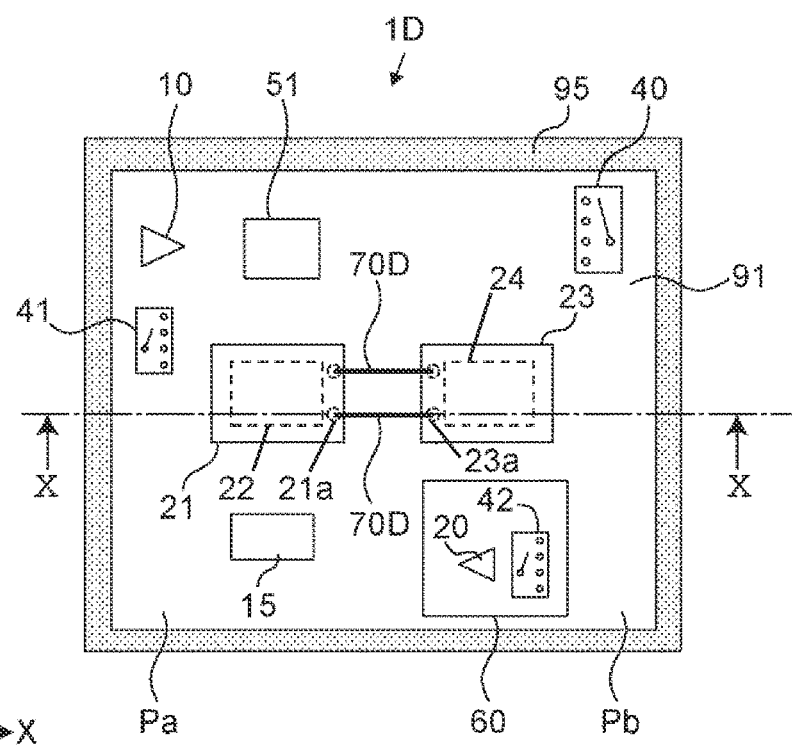
FIG. 9 is a plan view illustrating an example of a configuration of a radio frequency module according to a second embodiment.
Figure 10:
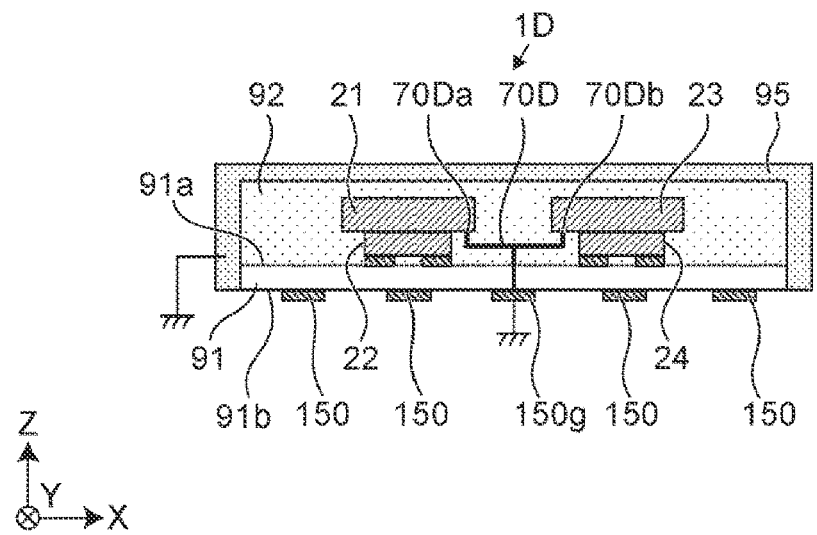
FIG. 10 is a cross-sectional view taken along line X-X of FIG. 9.

Next, a radio frequency module 1D according to a second embodiment is described with reference to FIGS. 9 and 10. FIG. 9 is a plan view of the radio frequency module 1D according to the second embodiment. FIG. 10 is a cross-sectional view of the radio frequency module 1D according to the second embodiment.

As illustrated in FIGS. 9 and 10, the radio frequency module 1D of the second embodiment differs from the radio frequency module 1 of the first embodiment in the shape of a metallic body 70D. Below, the descriptions of the features common to the radio frequency module 1D of the second embodiment and the radio frequency module 1 of the first embodiment are omitted, and the differences between them are mainly described.

The metallic body 70D according to the second embodiment has such a shape that the upper end of the metallic body 70D branches into a first end portion 70Da and a second end portion 70Db. The first end portion 70Da of the metallic body 70D contacts the lower surface of the duplexer 21, and the second end portion 70Db of the metallic body 70D contacts the lower surface of the duplexer 23. This makes it possible to improve the isolation between the duplexer 22 and the duplexer 24. Also, because the lower end of the metallic body 70D is in contact with the substrate 91, the heat of the duplexer 21 and the duplexer 23 can be transferred to the substrate 91 via the metallic body 70D. This makes it possible to improve the heat dissipation of the duplexer 21 and the duplexer 23.

In FIG. 9, two metallic bodies 70D are arranged in the Y direction between the duplexer 21 and the duplexer 23. Alternatively, only one metallic body 70D may be provided, or three or more metallic bodies 70D may be arranged in the Y direction. As the number of metallic bodies 70D increases, the isolation between the duplexer 22 and the duplexer 24 is further improved, and the heat dissipation of each of the duplexers is further improved.

Also, the first end portion 70Da of the metallic body 70D may be connected to a ground terminal 21a of the duplexer 21, the second end portion 70Db of the metallic body 70D may be connected to a ground terminal 23a of the duplexer 23, and the lower end of the metallic body 70D may be connected to the ground terminal 150g of the substrate 91. Compared with a configuration in which the ground terminals 21a and 23a of the duplexers 21 and 23 are connected to the ground terminal 150g of the substrate 91 using wires, connecting the ground terminals 21a and 23a to the ground terminal 150g using the metallic body 70D eliminates the need to lay out the wires and thereby makes it possible to reduce the distance between the duplexers 21 and 23. Also, it is possible to reduce the distance between each of the duplexers 21 and 23 and the metal shield layer 95. This in turn makes it possible to reduce the surface mounting area and the height of the radio frequency module 1D.

Figure 11:
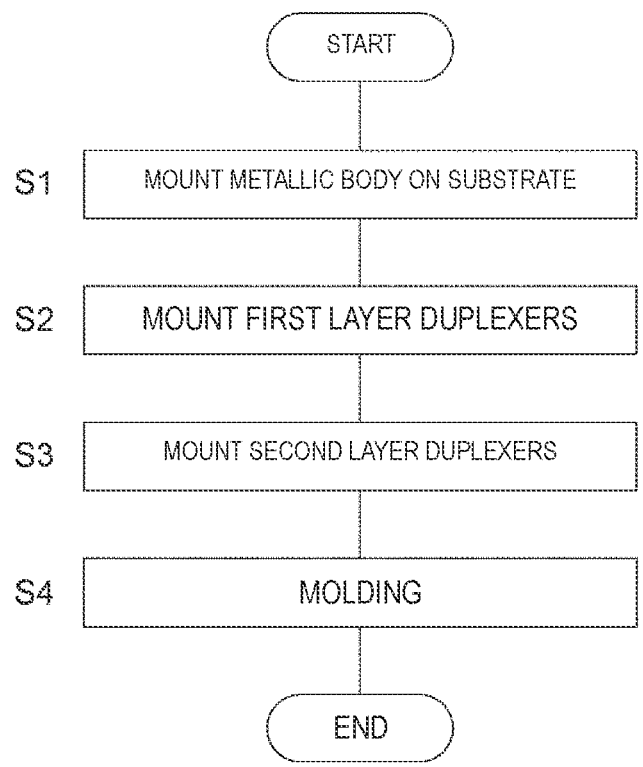
FIG. 11 is a flowchart illustrating a process of manufacturing a radio frequency module.
Figure 12:
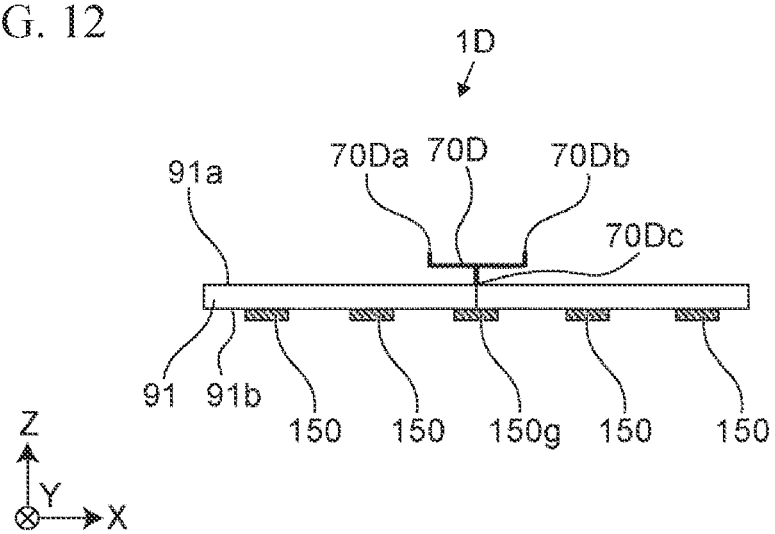
FIG. 12 is a drawing for describing the process of manufacturing the radio frequency module.
Figure 13:
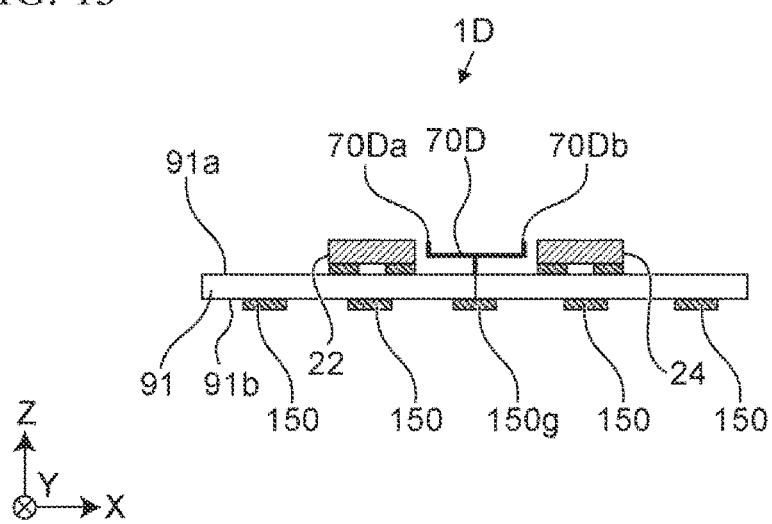
FIG. 13 is a drawing for describing the process of manufacturing the radio frequency module.
Figure 14:
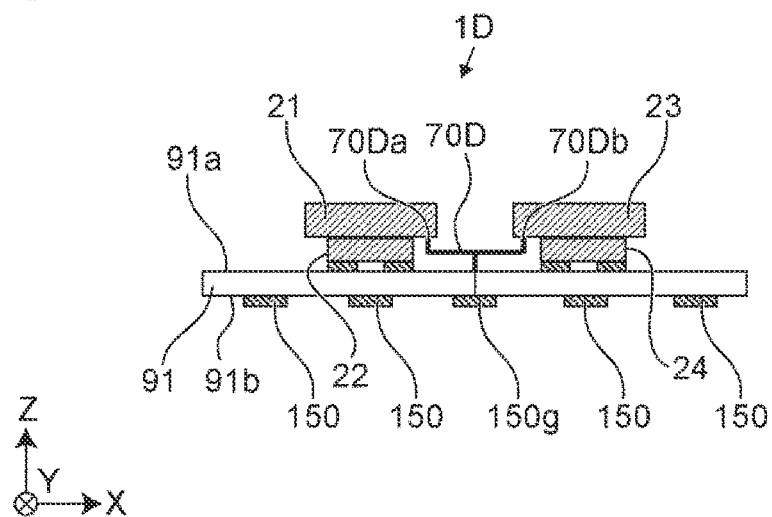
FIG. 14 is a drawing for describing the process of manufacturing the radio frequency module.

Next, a method of manufacturing the radio frequency module 1D is described with reference to FIGS. 11 through 14. FIG. 11 is a flowchart illustrating a process of manufacturing the radio frequency module 1D. FIGS. 12 through 14 are drawings for describing the process of manufacturing the radio frequency module 1D.

At step S1, as illustrated in FIG. 12, a mounting device attaches a lower end 70Dc of the metallic body 70D to the first major surface 91a of the substrate 91.

At step S2, as illustrated in FIG. 13, the mounting device mounts the duplexer 22 and the duplexer 24 of the first layer on the first major surface 91a of the substrate 91.

At step S3, as illustrated in FIG. 14, the mounting device mounts the duplexers 21 and 23 of the second layer on the duplexers 22 and 24 of the first layer, respectively. At this step, the duplexers 21 and 23 of the second layer are mounted such that the lower surface of the duplexer 21 contacts the first end portion 70Da of the metallic body 70D and the lower surface of the duplexer 23 contacts the second end portion 70Db of the metallic body 70D.

At step S4, as illustrated in FIG. 10, after a molding device deposits the resin component 92, a drying device thermally cures the resin component 92. Then, a sputtering device forms the metal shield layer 95 to cover the surface of the cured resin component 92. Through the above process, the radio frequency module 1D can be manufactured.

The radio frequency module 1D described above can improve the isolation between the duplexer 22 and the duplexer 24. Also, the above configuration makes it possible to reduce the area necessary to connect the duplexer 21 and the duplexer 23 to the ground and arrange the duplexer 21 and the duplexer 23 closer to each other, and thereby makes it possible to reduce the size of the radio frequency module 1D.

Figure 15:
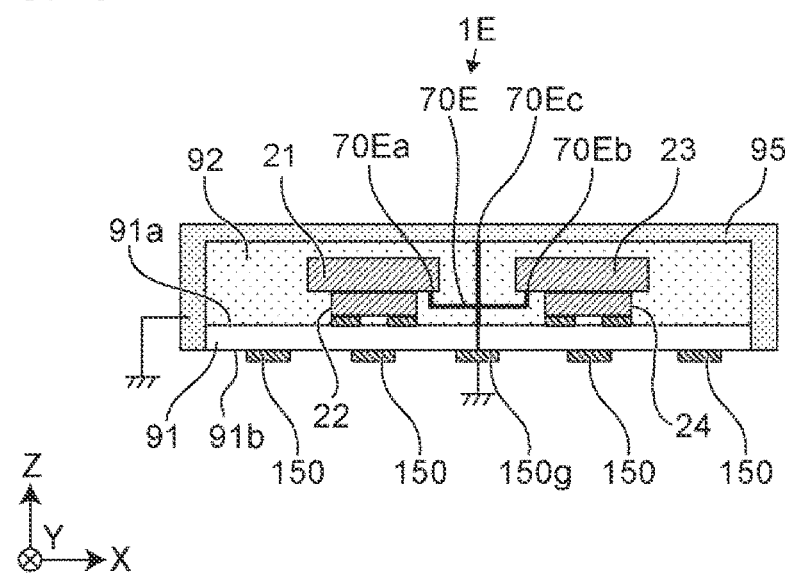
FIG. 15 is a cross-sectional view of a radio frequency module according to a variation of the second embodiment.

Next, a radio frequency module 1E according to a variation of the radio frequency module 1D of the second embodiment is described with reference to FIG. 15. FIG. 15 is a cross-sectional view of the radio frequency module 1E according to a variation of the second embodiment.

As illustrated in FIG. 15, the radio frequency module 1E of this variation differs from the radio frequency module 1D of the second embodiment in that the upper end of a metallic body 70E branches into three parts, i.e., a first end portion 70Ea, a second end portion 70Eb, and a third end portion 70Ec. The first end portion 70Ea and the second end portion 70Eb of the metallic body 70E correspond to the first end portion 70Da and the second end portion 70Db of the metallic body 70D of the second embodiment, respectively. Below, the descriptions of the features common to the radio frequency module 1E of this variation and the radio frequency module 1 of the first embodiment are omitted, and the differences between them are mainly described.

The third end portion 70Ec of the metallic body 70E extends between the first end portion 70Ea and the second end portion 70Eb from the branch point of the metallic body 70E toward the top surface of the resin component 92 in the thickness direction of the substrate 91, and is in contact with the metal shield layer 95. With this configuration, because a part of the metallic body 70E extends between the duplexer 21 and the duplexer 23 of the second layer toward the top surface of the resin component 92, it is possible to improve the isolation between the duplexer 21 and the duplexer 23 of the second layer.

Other Embodiments

Radio frequency modules and a communication device according to the present disclosure are described above in embodiments and their variations. However, the radio frequency modules and the communication device according to the present disclosure are not limited to those described in the embodiments and their variations. Other embodiments implemented by combining components in the above embodiments and their variations, variations obtained by applying various modifications conceivable by a person skilled in the art to the above embodiments and their variations without departing from the spirit of the present disclosure, and various devices including the radio frequency modules and the communication device described above are also included in the present disclosure.

For example, although duplexers are stacked in the first and second embodiments, the present disclosure is not limited to these embodiments. The power amplifier 10 or the matching circuit 51 may be stacked on the duplexer 22 in the first region Pa, and the semiconductor IC 60 or the switch 40 may be stacked on the duplexer 24 in the second region Pb. Also, instead of duplexers, transmission filters or reception filters may be stacked on each other.

Aspects

As is apparent from the above embodiments and variations, the present disclosure includes aspects as described below.

According to a first aspect, a radio frequency module includes a substrate having a first major surface and a second major surface that face each other, a first component disposed on or over the first major surface of the substrate, a second component disposed on the first component, a third component disposed on or over the first major surface of the substrate, and a metallic body connected to a ground. One end of the metallic body is connected to the first major surface of the substrate; and in plan view, the metallic body is disposed between the first component and the third component. This aspect makes it possible to improve the isolation between a multilayer body, which is constituted by the first component disposed on or over the substrate and the second component stacked on the first component, and the third component disposed on or over the substrate.

According to a second aspect, the radio frequency module of the first aspect is configured such that in plan view, the first component is disposed within and overlaps a region of the second component; and in plan view, the metallic body is disposed between the second component and the third component. This aspect makes it possible to improve the isolation between the first and second components stacked and disposed on the substrate and the third component disposed on the substrate. Here, the region of the second component in plan view indicates a region defined by the perimeter of the second component in plan view.

According to a third aspect, the radio frequency module of the first or second aspect is configured such that, in the thickness direction of the substrate, a distance from the first major surface of the substrate to another end of the metallic body is greater than the distance from the first major surface of the substrate to the top surface of the third component. This aspect makes it possible to further improve the isolation between the first and second components stacked and disposed on the substrate and the third component disposed on the substrate.

According to a fourth aspect, the radio frequency module of the first or second aspect is configured such that, in the thickness direction of the substrate, a distance from the first major surface of the substrate to another end of the metallic body is greater than a distance from the first major surface of the substrate to the top surface of the second component. This aspect makes it possible to further improve the isolation between the first and second components stacked and disposed on the substrate and the third component disposed on the substrate.

According to a fifth aspect, the radio frequency module of any one of the first through fourth aspects further includes a fourth component disposed on the third component. Accordingly, the third component and the fourth component are stacked in this order on the first major surface of the substrate. This aspect makes it possible to improve the isolation between the first and second components stacked and disposed on the substrate and the third and fourth components stacked and disposed on the substrate.

According to a sixth aspect, the radio frequency module of the fifth aspect is configured such that, in the thickness direction of the substrate, a distance from the first major surface of the substrate to another end of the metallic body is greater than the distance from the first major surface of the substrate to the top surface of the third component and the distance from the first major surface of the substrate to the top surface of the fourth component. This aspect makes it possible to further improve the isolation between the first and second components stacked and disposed on the substrate and the third and fourth components stacked and disposed on the substrate.

According to a seventh aspect, in the radio frequency module of the fifth or sixth aspect, the second component is a transmission circuit component. This aspect makes it possible to improve the isolation between the transmission circuit component stacked on the first component on the substrate and the third and fourth components stacked and disposed on the substrate.

According to an eighth aspect, in the radio frequency module of the seventh aspect, the fourth component is a reception circuit component. This aspect makes it possible to improve the isolation between the transmission circuit component stacked on the first component on the substrate and the reception circuit component stacked on the third component disposed on the substrate.

According to a ninth aspect, in the radio frequency module of any one of the first through eighth aspects, the substrate includes a ground electrode and the one end of the metallic body is connected to the ground electrode. This aspect makes it possible to further improve the isolation between the first and second components stacked and disposed on the substrate and the third component disposed on the substrate.

According to a tenth aspect, the radio frequency module of any one of the first through ninth aspects further includes a resin component that covers the first major surface and at least partially covers the first component, the second component, and the third component; and a metal shield layer that covers the surface of the resin component and is connected to the ground. This aspect makes it possible to improve the isolation between the first, second, and third components and the outside of the radio frequency module.

According to an eleventh aspect, in the radio frequency module of the tenth aspect, the second component is in contact with the metal shield layer. This aspect makes it possible to transfer the heat of the second component to the metal shield layer and thereby makes it possible to improve the heat dissipation of the second component.

According to a twelfth aspect, in the radio frequency module of the tenth or eleventh aspect, another end of the metallic body is connected to the metal shield layer. This aspect makes it possible to further improve the isolation between the first and second components stacked and disposed on the substrate and the third component disposed on the substrate.

According to a thirteenth aspect, in the radio frequency module of any one of the first through twelfth aspect, at least one of the first component and the second component is an acoustic wave filter. This aspect makes it possible to improve the isolation between the third component and the acoustic wave filter on the substrate or the acoustic wave filter stacked on the first component.

According to a fourteenth aspect, in the radio frequency module of any one of the first through twelfth aspects, at least one of the first component and the second component is an integrated circuit component. This aspect makes it possible to improve the isolation between the integrated circuit component and the third component.

According to a fifteenth aspect, in the radio frequency module of any one of the first through fourteenth aspects, an integrated circuit component is disposed on the second major surface of the substrate, and in plan view, each of the first component and the second component at least partially overlaps the integrated circuit component disposed on the second major surface. This aspect makes it possible to reduce the surface mounting area of the radio frequency module.

According to a sixteenth aspect, in the radio frequency module of any one of the first through fifteenth aspects, in plan view, the metallic body is disposed on the substrate between a transmission-side component region in which at least an amplifier is located and a reception-side component region in which at least a low-noise amplifier is located. This aspect makes it possible to improve the isolation between the transmission-side component region and the reception-side component region.

According to a seventeenth aspect, in the radio frequency module of any one of the first through sixteenth aspects, the metallic body includes a wall extending in the thickness direction of the substrate. This aspect makes it possible to further improve the isolation between the first and second components stacked and disposed on the substrate and the third component disposed on the substrate.

According to an eighteenth aspect, in the radio frequency module of any one of the first through seventeenth aspects, the metallic body is connected to a ground terminal of the second component. This aspect makes it possible to reduce the area necessary to connect the second component to the ground and thereby makes it possible to reduce the size of the radio frequency module.

According to a nineteenth aspect, in the radio frequency module of any one of the first through eighth aspects, another end of the metallic body branches into a first end portion and a second end portion, the first end portion of the metallic body is connected to a ground terminal of the second component, and the second end portion of the metallic body is connected to a ground terminal of the fourth component. This aspect makes it possible to reduce the area necessary to connect the second component and the fourth component to the ground and thereby makes it possible to reduce the size of the radio frequency module.

According to a twentieth aspect, a communication device includes an RF signal processing circuit that processes radio frequency signals transmitted and received via an antenna and the radio frequency module according to any one of the first through nineteenth aspects that transmits the radio frequency signals between the antenna and the RF signal processing circuit. This aspect makes it possible to provide a communication device with excellent communication performance.

According to a twenty-first aspect, in the radio frequency module of any one of the first through thirteenth aspects, the third component is an acoustic wave filter. This aspect makes it possible to improve the isolation between the second component stacked on the first component and the acoustic wave filter.

The present disclosure can be widely used for communication devices, such as a mobile phone, as a radio frequency module disposed in a multiband front-end unit.

1 radio frequency module
2 antenna
3 RF signal processing circuit (RFIC)
4 baseband signal processing circuit (BBIC)
5 communication device
10 power amplifier
15 control circuit
20 low-noise amplifier (LNA)
21, 22, 23, 24 duplexer
31, 33, 35, 37 transmission filter
32, 34, 36, 38 reception filter
40, 41, 42 switch
40a, 41a, 42a common terminal
40b, 40c, 41b, 41c, 42b, 42c selection terminal
51 matching circuit
60 semiconductor IC
70 metallic body
91 substrate
91a first major surface
91b second major surface
92 resin component
95 metal shield layer
100 antenna connection terminal
110 transmission input terminal
120 reception output terminal
130 control signal terminal
150 external connection terminal
150g ground terminal
AR, BR, CR, DR reception path
AT, BT, CT, DT transmission path
CTR transmission-reception path
Pa first region
Pb second region

The invention claimed is:
1. A radio frequency module comprising:
a substrate having a first major surface and a second major surface, the first major surface and the second major surface facing each other;
a first component disposed on or over the first major surface of the substrate;
a second component disposed on the first component;
a third component disposed on or over the first major surface of the substrate; and
a metallic body connected to a ground, wherein
one end of the metallic body is connected to the first major surface of the substrate; and
in plan view, the metallic body is disposed between the first component and the third component.
2. The radio frequency module according to claim 1, wherein
in plan view, the first component is disposed within and overlaps a region of the second component; and
in plan view, the metallic body is disposed between the second component and the third component.

3. The radio frequency module according to claim 1, wherein
in a thickness direction of the substrate, a distance from the first major surface of the substrate to another end of the metallic body is greater than a distance from the first major surface of the substrate to a top surface of the third component.

4. The radio frequency module according to claim 1, wherein
in a thickness direction of the substrate, a distance from the first major surface of the substrate to another end of the metallic body is greater than a distance from the first major surface of the substrate to a top surface of the second component.

5. The radio frequency module according to claim 1, further comprising:
a fourth component disposed on the third component.

6. The radio frequency module according to claim 5, wherein
in a thickness direction of the substrate, a distance from the first major surface of the substrate to another end of the metallic body is greater than each of a distance from the first major surface of the substrate to a top surface of the third component and a distance from the first major surface of the substrate to a top surface of the fourth component.

7. The radio frequency module according to claim 5, wherein
the second component is a transmission circuit component.

8. The radio frequency module according to claim 7, wherein
the fourth component is a reception circuit component.

9. The radio frequency module according to claim 1, wherein
the substrate includes a ground electrode; and
the one end of the metallic body is connected to the ground electrode.

10. The radio frequency module according to claim 1, further comprising:
a resin component covering the first major surface and at least partially covering the first component, the second component, and the third component; and
a metal shield layer covering a surface of the resin component and connected to the ground.

11. The radio frequency module according to claim 10, wherein
the second component is in contact with the metal shield layer.

12. The radio frequency module according to claim 10, wherein
another end of the metallic body is connected to the metal shield layer.

13. The radio frequency module according to claim 1, wherein
at least one of the first component and the second component is an acoustic wave filter.

14. The radio frequency module according to claim 1, wherein
at least one of the first component and the second component is an integrated circuit component.

15. The radio frequency module according to claim 1, wherein
an integrated circuit component is disposed on the second major surface of the substrate; and
in plan view, each of the first component and the second component at least partially overlaps the integrated circuit component disposed on the second major surface.

16. The radio frequency module according to claim 1, wherein
in plan view, the metallic body is disposed on the substrate between a transmission-side component region in which at least an amplifier is located and a reception-side component region in which at least a low-noise amplifier is located.

17. The radio frequency module according to claim 1, wherein
the metallic body includes a wall extending in a thickness direction of the substrate.

18. The radio frequency module according to claim 1, wherein
the metallic body is connected to a ground terminal of the second component.

19. The radio frequency module according to claim 5, wherein
another end of the metallic body branches into a first end portion and a second end portion;
the first end portion of the metallic body is connected to a ground terminal of the second component; and
the second end portion of the metallic body is connected to a ground terminal of the fourth component.

20. A communication device comprising:
an RF signal processing circuit configured to process radio frequency signals transmitted and received via an antenna; and
the radio frequency module according to claim 1 configured to transmit the radio frequency signals between the antenna and the RF signal processing circuit.

* * * * *